United States Patent [19]
Hashimoto et al.

[11] Patent Number: 5,354,385
[45] Date of Patent: Oct. 11, 1994

[54] SOLAR CELL

[75] Inventors: Yuichi Hashimoto, Tokyo; Teigo Sakakibara; Hisami Tanaka, both of Yokohama, all of Japan

[73] Assignee: Canon Kabushiki Kaisha, Tokyo, Japan

[21] Appl. No.: 953,009

[22] Filed: Sep. 29, 1992

[30] Foreign Application Priority Data

Sep. 30, 1991 [JP] Japan .................. 3-251896

[51] Int. Cl.⁵ .......................................... H01L 31/048
[52] U.S. Cl. ........................... 136/259; 136/251; 257/433; 257/789; 257/795
[58] Field of Search ............ 136/245, 251, 258 AM, 136/259, 263; 257/433, 789, 795

[56] References Cited

U.S. PATENT DOCUMENTS 4,433,201 2/1984 Fellas ................... 136/251

FOREIGN PATENT DOCUMENTS 63-185071 7/1988 Japan ..................... 136/259
3-185769 8/1991 Japan ..................... 136/259

*Primary Examiner*—Aaron Weisstuch
*Attorney, Agent, or Firm*—Fitzpatrick, Cella, Harper & Scinto

[57] ABSTRACT

A solar cell, comprising a solar cell unit and a protective layer formed on the solar cell unit, wherein the protective layer comprises conductive particles.

16 Claims, 3 Drawing Sheets

SOLAR CELL

BACKGROUND OF THE INVENTION

Field of the Invention

The present invention relates to a solar cell, particularly a solar cell having a protective layer.

Solar cells have attracted attention as an energy supply means since they are free from the problem of air pollution occurring in thermal or nuclear electric power generation and electric energy can be obtained at any location where solar energy is available.

Under the existing circumstances, however, the production (or manufacturing) cost of solar cells is high and the conversion efficiency (or energy conversion efficiency) thereof is not always satisfactory. In addition, solar cells have a problem in durability, so that solar cells are not widely popular at the present stage. In order to further popularize the solar cell, long-term outdoor durability, in addition to an improvement in the conversion efficiency, is required. A protective layer plays an important part in improving durability and reliability of solar cells under such conditions.

Further, an electrode constituting a solar cell unit is generally liable to be oxidized by moisture, so that it is preferable that the solar cell be sheltered from the outside by the medium of a protective layer to improve moisture resistance, weathering resistance, etc.

There have been proposed a protective layer for a conventional solar cell comprising a resin film such as a polymethylmethacrylate or epoxy resin film (Japanese Laid-Open Patent Application No. (JP-A) 88481/1985), a silicone resin film (French Patent No. (FR) 2426337), or a fluorine-containing resin film (JP-A 73942/1984).

These protective layers, however, inherently have an insulating property, and so dust or dirt is liable to adhere to or cover the surface of such protective layers. As a result, light transmission of the conventional solar cell is hindered, thus lowering the conversion efficiency in some cases.

SUMMARY OF THE INVENTION

An object of the present invention is to provide a solar cell capable of preventing dust and/or dirt from electrostatically adhering to the surface thereof and having a stable (energy) conversion efficiency without lowering light transmittance and durability even in a long-term use.

According to the present invention, there is provided a protected solar cell, comprising a solar cell unit and a protective layer formed on the solar cell unit, wherein the protective layer comprises conductive particles.

These and other objects, features and advantages of the present invention will become more apparent upon a consideration of the following description of the preferred embodiments of the present invention taken in conjunction with the accompanying drawings.

DETAILED DESCRIPTION OF THE INVENTION

Figure 1:
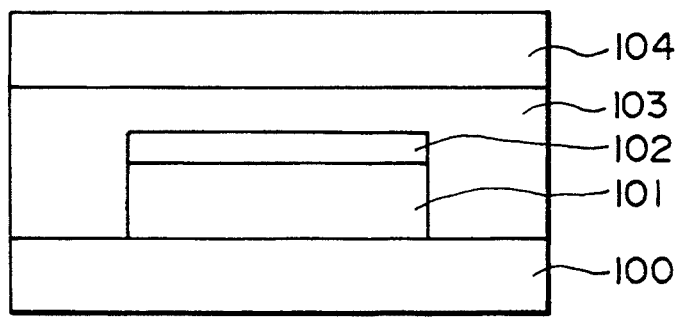
FIG. 1 is a schematic sectional view showing an embodiment of the solar cell according to the present invention.

The protected solar cell according to the present invention includes a protective layer containing conductive particles disposed on a solar cell unit.

In the present invention, it is possible to arbitrarily control the electric resistance of the protective layer of the solar cell by employing the above structure, so that dust hardly adheres to the protective layer electrostatically, and thus a lowering of the energy conversion efficiency of the solar cell can be reduced without hindering light transmission.

The conductive particles used in the present invention may include fine particles of a metal, an alloy, a metal oxide, etc. Examples of the metal or alloy fine particles may include: those comprising aluminum, zinc, copper, chromium, nickel, stainless steel, silver, and alloys of these materials. Examples of the metal oxide fine particles may include: those comprising zinc oxide, titanium oxide, tin oxide, antimony oxide, indium oxide, bismuth oxide, indium oxide doped with tin, tin oxide doped with antimony, and zirconium oxide. Further, the conductive particles may also include those comprising plastic coated with the above metals, alloys, or metal oxides. These materials may be used singly or in combination of two or more species. When the above materials are used in combination of two or more species, they may be simply mixed or formed into a solid solution or a fusing mixture. In the present invention, the metal oxide may preferably be used as the conductive particles in view of transparency, etc.

The protective layer used in the present invention may be formed by applying a dispersion of conductive particles as described above in a resin component onto a solar cell unit, followed by drying and preferably further curing. The resin component may include a thermoplastic resin or a curable resin. In a case where the thermoplastic resin is used, the protective layer may be formed by incorporating and dispersing conductive particles in the thermoplastic resin and shaping the resultant solid material into a resin sheet containing the conductive particles, followed by adhesion to a solar cell unit.

Examples of the resin component used in the present invention may include: polyimide, polyester, polycarbonate, polystyrene, polyvinyl chloride, cellulose, fluorine-containing resin, phenolic resin, polyethylene, polypropylene, polyurethane, acrylic resin, nylon, silicone resin, alkyd resin and vinyl chloride-vinyl acetate copolymer. Preferred examples of the resin component may include: polycarbonate, polyimide, polyvinyl chloride, a fluorine-containing resin, a phenolic resin, polyurethane, an acrylic resin, and a silicone resin. In the above preferred examples of the resin component, a curable resin such as polyimide, phenolic resin, polyurethane, acrylic resin, or silicone resin may more preferably be used.

The method for applying the above-mentioned dispersion during formation of the protective layer may be: dipping, spray coating, spinner coating or beam coating. Further, as another method of forming the protective layer, a known shaping method such as an inflation method, extrusion, or injection molding may be applied. In the present invention, the above-prepared protective layer may preferably be further cured or hardened by heating or radiating ultraviolet light or an electron beam, depending on the kind of resin component and initiator.

In formulating the protective layer used in the present invention, the above-mentioned conductive particles may be contained in the protective layer in a proportion of 5–90 wt.%, preferably 10–80 wt.%. When the content of the conductive particles is below 5 w.%, the electric resistance of the resultant protective layer is inclined to become too high, whereby dust and/or dirt readily adhere to the surface of the protective layer electrostatically. On the other hand, when the content of the conductive particles exceeds 90 wt.%, the resultant protective layer has a sufficiently lower electric resistivity to cause a short circuit, thus failing to function as a solar cell or causing a lowering of the output of the solar cell due to a decrease in transparency in some cases.

The thickness of the above protective layer may be 10–200 microns, particularly 30–100 microns. Below 10 microns, durability of the protective layer becomes insufficient in some cases. Above 200 microns, transparency of the protective layer sometimes becomes too low.

Hereinbelow, an average particle size (or diameter) of the conductive particles used in the present invention will be described.

Generally speaking, when particles are dispersed in a resin component, it is preferable that the particle size of the dispersed particles is smaller than the wavelength of visible incident light (i.e., at most 0.3 micron) so as to suppress scattering of the visible incident light. In the present invention, the average particle size of the conductive particles in the protective layer may be at most 0.3 micron, preferably at most 0.1 micron, in view of the light transmittance required for the protective layer.

Further, taking the possibility of formation of a secondary particle at the dispersion step into consideration, the average primary particle size of the conductive particles before dispersion may be at most 0.1 micron, preferably 0.05 micron.

In the present invention, the average primary particle size of the conductive particles is measured by using a scanning electron microscope (SEM; magnification=10,000). More specifically, the sizes of 100 arbitrarily chosen conductive particles are measured by the SEM and then the resultant mean value is evaluated as the average particle size. On the other hand, the average particle size of the conductive particles in the protective layer is obtained by measuring particle sizes of 30 arbitrarily chosen conductive particles in the protective layer by means of a transmission electron microscope (TEM; magnification=10,000) and calculating their mean value.

Table 1 appearing below shows some measured values with respect to particle sizes and transmittance of tin oxide particles:

(1) Average primary particle size before dispersion;
(2) Average particle size of dispersed particles immediately after dispersion;
(3) Average particle size of dispersed particles after 1 month;
(4) Visible light transmittance of a film formed by using the dispersion with respect to the above item (2) (i.e., immediately after dispersion); and
(5) Visible light transmittance of a film formed by using the dispersion with respect to the above item (3) (i.e., after 1 month).

In this instance, the dispersion was prepared by mixing 60 parts by weight (hereinafter, simply referred to as "part(s)") of a resol-type phenolic resin (J-325, manufactured by Dainippon Inki Kagaku Kogyo K.K.), 30 parts of tin oxide and 300 parts of methyl cellosolve (ethylene glycol monomethyl ether) and dispersing the mixture for 48 hours by means of a sand mill. The above-mentioned film was formed by applying the dispersed mixture on a glass plate by spray coating. The thickness of the film was 100 microns.

The average particle size in the protective layer was not substantially changed compared with that of the dispersed particles.

TABLE 1

| Average particle size of tin oxide (μm) | | | Transmittance (%)[*3] | |
|---|---|---|---|---|
| (1) Primary particle[*1] | (2) Immediately after dispersion[*2] | (3) After 1 month[*2] | (4) Layer in state (2) | (5) Layer in state (3) |
| 0.05 | 0.05 | 0.05 | 90 | 90 |
| 0.08 | 0.1 | 0.15 | 75 | 58 |
| 0.1 | 0.12 | 0.27 | 66 | 40 |
| 0.2 | 0.25 | 0.4 | 47 | 30 |

[*1]Measured by a SEM (S-800, manufactured by K.K. Hitachi Seisakusho) with 100 tin oxide particles.
[*2]Measured by a particle size distribution-measuring apparatus (CAPA-700, mfd. by K.K. Horiba Seisakusho).
[*3]Measured by an ultraviolet-visible light spectrophotometer (UV-2200, mfd. by K.K. Shimazu Seisakusho).

Table 2 appearing below shows some measured values with respect to particle sizes and transmittance of indium tin oxide (ITO or indium oxide doped with tin):

(1) Average primary particle size before dispersion;
(2) Average particle size of dispersed particles (in a polycarbonate resin immediately after dispersion); and
(3) visible light transmittance of a film formed by using the dispersion with respect to the above item (2).

In this instance, a protective layer was formed by melt-kneading 70 parts of a polycarbonate resin (Yupiron Z-200, mfd. by Mitsubishi Gas Kagaku K.K.) and 30 parts of ITO particles to provide a pellet. The pellet was subjected to extrusion to form into a 100 micron-thick film to be measured.

TABLE 2

| Average particle size of ITO (μm) | | Transmittance (%)[*3] |
|---|---|---|
| (1) Primary particle[*1] | (2) In the protective layer[*2] | (3) Layer in stage (2) |
| 0.04 | 0.05 | 88 |
| 0.07 | 0.12 | 60 |
| 0.11 | 0.2 | 49 |
| 0.2 | 0.53 | 11 |

[*1]Measured by a SEM (S-800, manufactured by K.K. Hitachi Seisakusho) with 100 ITO particles.
[*3]Measured by a ultraviolet-visible light spectrophotometer (UV-2200, mfd. by K.K. Shimazu Seisakusho).
[*4]Measured by a TEM (H-800, mfd. by K.K. Hitachi Seisakusho) with 30 ITO particles.

FIG. 1 shows a schematic sectional view of an embodiment of the solar cell according to the present invention. Referring to FIG. 1, the solar cell comprises a photosensitive layer 101, a transparent electrode 102, an adhesive layer 103, and a protective layer 104 disposed in this order on an electrode 100 which also functions as a support. Herein, the electrode 100, the photosensitive layer 101 and the transparent electrode 102 inclusively are referred to as a "solar cell unit". Thus, the solar cell of the invention comprises the protective layer 104, the adhesive layer 103, and the solar cell unit.

Figure 2:
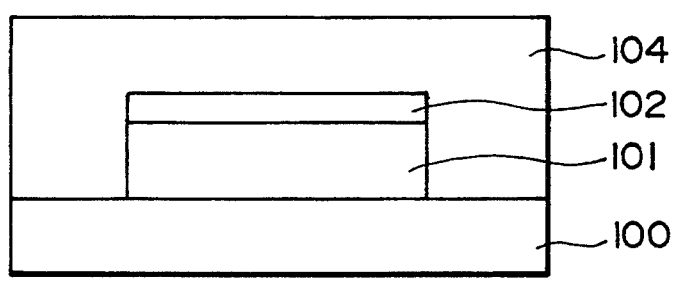
FIG. 2 is a schematic sectional view showing another embodiment of the solar cell according to the present invention.

FIG. 2 shows a schematic sectional view of another embodiment of the solar cell according to the present invention. In FIG. 2, the reference numerals 100, 101, 102, and 104 denote the same constituents as described above (FIG. 1), respectively. In this instance, the solar cell comprises the protective layer 104 and the solar cell unit.

In the present invention, it is possible to add an additive such as a coupling agent or an antioxidant to the protective layer in order the improve dispersibility, adhesiveness, environmental stability (i.e., stability against a change in electric resistivity due to a change of temperature or humidity or stability against deterioration due to light), etc.

The solar cell unit used in the present invention may include the above-mentioned photosensitive layer and the above-mentioned two electrodes sandwiching the photosensitive layer therebetween. Referring to FIG. 1, the solar cell unit comprises the electrode 100, the photosensitive layer 101, and the transparent electrode 102 disposed in this order.

The photosensitive layer 101 as shown in FIG. 1 may include: an inorganic substance such as amorphous silicon (a-Si) or CdS/CdTe; an organic substance such as phthalocyanine or its derivatives.

The electrodes 100 and 102 as shown in FIG. 1 may include: those comprising various metals, alloys, conductive metal oxides; and those comprising paper, plastic, or glass which has been subjected to conductive treatment with the above-mentioned metals, alloys, or metal oxides. Examples of the electrodes 100 and 102 may include: aluminum, aluminum alloy, chromium, nickel, stainless steel, $In_2O_3$, and ITO. Since the electrode 102 used in the present invention is transparent, preferred examples of the electrode 102 may include those comprising the metal oxides such as $In_2O_3$ and ITO.

In the present invention, it is possible to dispose the adhesive layer 103 as shown in FIG. 1, which has transparency and comprises a resin as a principal component, between the protective layer and the solar cell unit in order to further enhance adhesive properties.

Examples of such a resin may include: an acrylic resin such as polybutyl methacrylate; a butyryl resin such as polyvinyl butyryl; and an epoxy resin.

Then, a production example of a solar cell including the photosensitive layer comprising an a-Si as an embodiment of the solar cell of the present invention will be explained hereinbelow.

Figure 5:
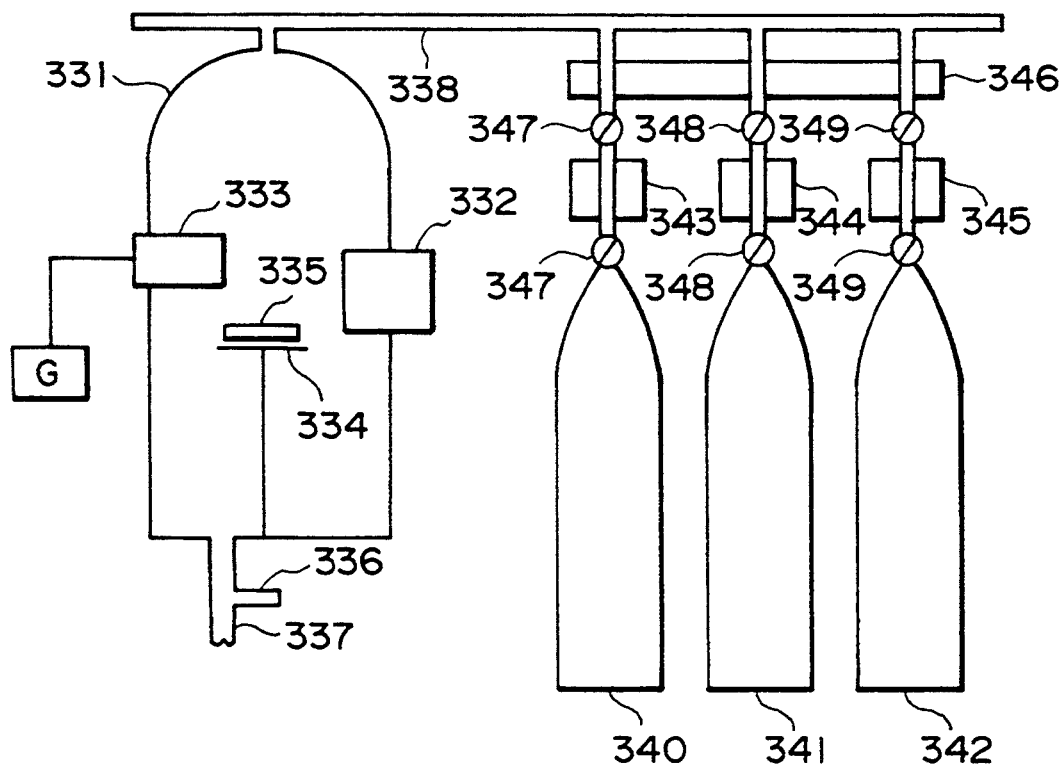
FIG. 5 is a schematic view of a radio frequency-chemical vapor deposition (RF-CVD) apparatus used in the examples and the comparative examples appearing hereinafter.

FIG. 5 is a schematic view showing an embodiment of a film-forming apparatus (RF-CVD apparatus) which can be used for producing a solar cell employing a-Si.

Referring to FIG. 5, the RF-CVD apparatus includes: a reactor (or reaction chamber) 331, a cathode for (electric) discharge 332, an anode for discharge 333, a heated turntable 334, a substrate 335 (as a conductive support), a pipe 336 connected to a vacuum gage, an exhaust vent 337, a gas feed pipe 338, steel gas cylinders 340, 341, and 342, flowmeters 343, 344, and 345, a cold trap 346, and flow control valves 347, 348, and 349.

An embodiment of the method of operation of the RF-CVD apparatus will now be explained with reference to FIG. 5.

An exhaust pump (not shown) connected with the exhaust vent 337 is operated and the internal pressure of the reactor 331 is reduced to about $1 \times 10^{-6}$ Torr, followed by heating and rotating the heated turntable 334 with the substrate 335 disposed thereon. The flow control valves 347 and 348 are opened almost simultaneously with the above heating step, thus supplying $SiH_4/H_2$ gas mixture and $PH_3/H_2$ gas mixture from the steel gas cylinders 340 and 341, respectively, to the reactor 331.

An electric discharge power supply G is driven to apply a high-frequency electric field to the resultant gas mixture, whereby glow discharge is generated between the anode 333 and the cathode 332. As a result, an n-type a-Si layer is deposited and formed on the substrate 335 and then the glow discharge is stopped. Then, the flow control valves 347 and 348 are closed to stop supply of the gas mixtures and residual gas in the reactor 331 is removed.

The valve 347 is opened to supply the $SiH_4/H_2$ gas mixture from the steel gas cylinder 340 to the reactor 331, thus generating glow discharge again. As a result, an i-type a-Si layer is deposited and formed on the n-type a-Si layer and the glow discharge is stopped. Then, the valve 347 is closed to stop supply of the gas mixture and residual gas in the reactor 331 is removed.

The valves 347 and 349 are then opened to supply the $SiH_4/H_2$ gas mixture and $B_2H_2$ gas mixture from the steel gas cylinders 340 and 342, respectively, to the reactor 331, thus generating glow discharge again. As a result, a p-type a-Si layer is deposited and formed on the i-type a-Si layer and the glow discharge is stopped. Then, the valves 347 and 349 are closed to stop supply of the gas mixtures gases and residual gas in the reactor 331 is removed.

The thus prepared n-type, i-type, and p-type a-Si layers are generally referred to as an "a-Si unit cell" and, herein also referred to as "photosensitive layer". In the present invention, an a-Si unit cell (photosensitive layer) may repetitively be laminated one or more times in order to enhance the electromotive force.

For example, on the p-type a-Si layer of the above-prepared a-Si unit cell, a transparent conductive material comprising a metal oxide such as tin oxide or indium oxide is formed by a known film-forming method such as electron beam (vacuum) vapor deposition or radio frequency (RF) sputtering process to obtain a transparent electrode.

An adhesive layer is disposed on the transparent conductive layer (electrode) and a dispersion of conductive particles in a resin component is applied onto the adhesive layer, followed by drying and curing with, e.g., ultraviolet light, as desired, to form a protective layer. As a result, a solar cell according to the present invention is prepared. It is preferable that the above-mentioned operation be performed in a vacuum vessel or by applying pressure or heating to an adhesive surface so as not to generate a bubble between the adhesive layer and the protective layer when the protective layer is formed on the adhesive layer.

Below, the present invention will be explained more specifically with reference to examples. It is however to be understood that the present invention is not restricted to these examples.

EXAMPLE 1 AND COMPARATIVE EXAMPLE 1

An a-Si unit cell was formed on an electrode (support) by using the above-mentioned RF-CVD apparatus as shown in FIG. 5 in the same manner as described above under the following conditions (1)–(8):

(1) Electrode support used: A 0.5 mm-thick stainless steel plate (size: 20 mm×20 mm), the surface of which has been subjected to mirror polishing.

(2) Volume ratio of each gas: $SiH_4/H_2=0.1$, $PH_3/H_2=5\times10^{-4}$, and $B_2H_6/H_2=5\times10^{-4}$.

(3) Volume mixing ratio of each gas mixture: $SiH_4/H_2$ gas mixture: $PH_3/H_2$ gas mixture = 100:1 to 1000:1, and $SiH_4/H_2$ gas: $B_2H_6/H_2$ gas mixture = 100:1 to 1000:1.

(4) Gas pressure in reactor: 2 to 5 Torr.

(5) High-frequency output of electric discharge power source G: 50 to 500 W (4 MHz).

(6) Temperature of stainless substrates: 250° to 350° C.

(7) Growth rate of each a-Si layer: $0.4\times10^{-4}$ to $1\times10^{-4}$ μm/sec for p-type and n-type a-Si layer, and $0.8\times10^{-4}$ to $3\times10^{-4}$ μm/sec for i-type a-Si layer.

(8) Thickness of each a-Si layer formed: 0.01 μm for n-type a-Si layer, 0.6 μm for i-type a-Si layer, and 0.003 μm for p-type a-Si layer.

The thickness of each a-Si layer can readily be controlled as desired by adjusting, e.g., the deposition time. In Examples 1–4 and Comparative Examples 1–5 appearing hereinafter, the above-mentioned thicknesses of the a-Si layers were employed.

Then, on the thus-prepared a-Si unit cell (photosensitive layer) formed on the electrode (support), an $In_2O_3$ electrode of a thickness of 0.05 μm was formed by the RF sputtering process mentioned above to prepare a solar cell unit.

Separately, a 100 μm-thick protective layer was prepared by melt-kneading 70 parts of a bisphenol A-type polycarbonate resin (viscosity-average molecular weight=20,000) and 30 parts of ITO fine particles (average primary particle size before dispersion=0.04 μm) with a biaxial vented extruder to provide a pellet and then subjecting the pellet to extrusion. The average particle size of the ITO fine particles in the protective layer (after dispersion) was 0.05 μm.

The above-prepared protective layer was disposed on the $In_2O_3$ electrode constituting the solar cell unit by the medium of a 50 μm-thick ethylene-vinyl acetate hot-melt sheet as an adhesive layer to obtain a solar cell of the invention as shown in FIG. 1. In the above adhesion step, an iron heated at 130° C. was used under a light pressure so as not to generate a bubble between the protective layer and the adhesive layer.

The thus-prepared solar cell having the protective layer (Example 1) and a solar cell separately prepared in the same manner as in Example 1 except for omitting the adhesive layer and the protective layer (Comparative Example 1) were subjected to a weathering resistance test for 2000 hours by using a xenon fadeometer (FAL-25 AX-HC.B.EC, mfd. by Suga Shikenki K.K.).

Figure 3:
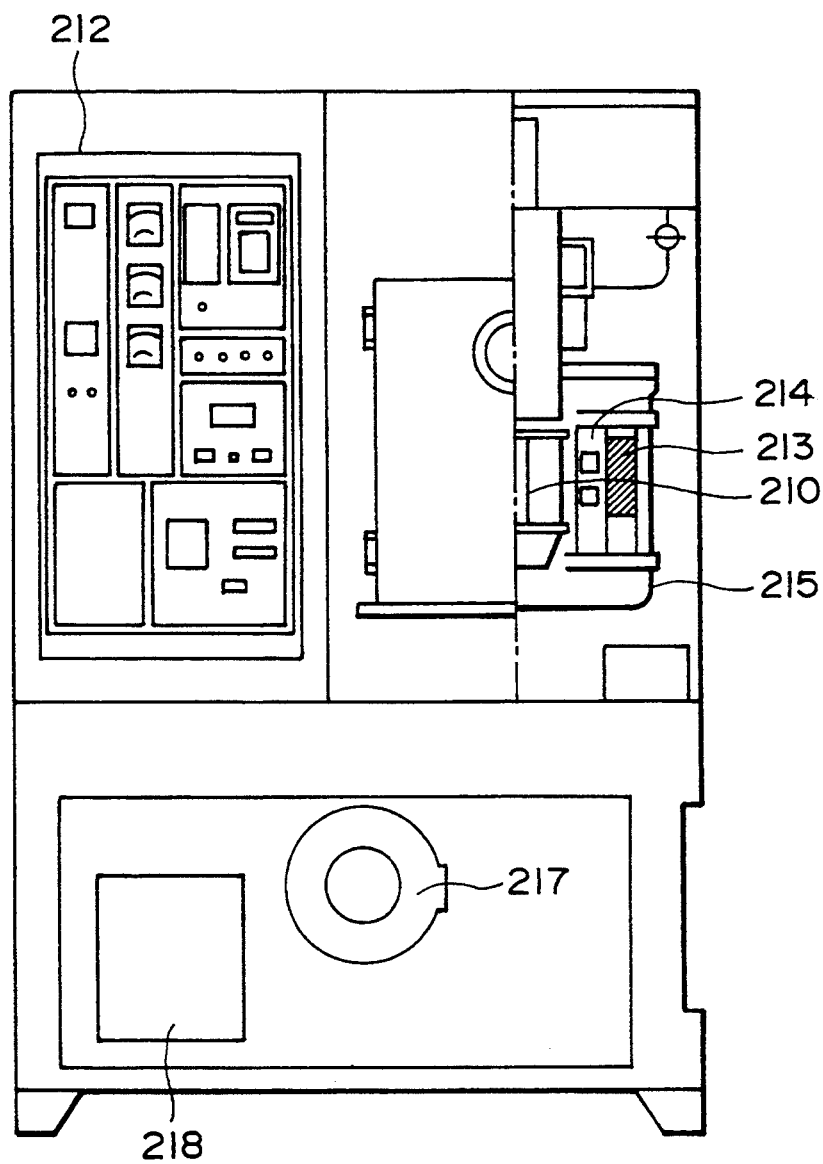
FIG. 3 is a schematic view of a weathering resistance testing apparatus used in the examples and comparative examples appearing hereinafter.
Figure 4:
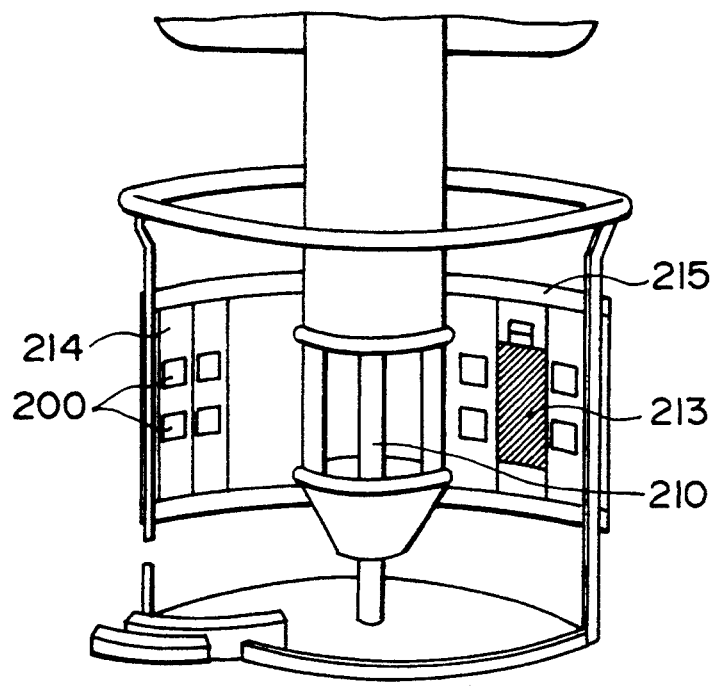
FIG. 4 is a partially enlarged view showing an internal structure of a test chamber of the weathering resistance testing apparatus shown in FIG. 3.

FIGS. 3 and 4 are schematic views showing an embodiment of the structure of the testing apparatus (xenon fadeometer) used herein. More specifically, FIG. 3 shows a front view thereof and also shows the structure of part of the internal test chamber. FIG. 4 shows a partially enlarged view of the internal test chamber.

Referring to FIG. 3, a control panel 212 equipped with, e.g., instruments and switches necessary for the operation of the testing apparatus is disposed at the upper left of the apparatus body. A test chamber is disposed inside at the upper right of the apparatus body and includes a xenon lamp 210 disposed at the center thereof and a sample frame 215 rotatable about the xenon lamp 210. At the lower part of the testing apparatus, a mechanical device equipped with, e.g., a blower 217 and a transformer 218 is disposed.

The above-mentioned testing apparatus was used for the weathering resistance test, which test was performed in the following manner.

First, a test sample 200 was set in a sample holder 214 fitted in the sample rotating frame 215 as shown in FIG. 4, and the testing temperature was controlled such that a black panel thermometer 213 fitted in the sample rotating frame 215 provided a measured value of 63°±3° C. As a result, the inside of the test chamber had a temperature of 45° C. The humidity thereof was set to 50%RH.

Then, the illuminance of the xenon lamp 210 was set so that a radiation illuminance meter (not shown) fitted in the inside of the testing apparatus provided a measured value of 0.5±0.02 W/m² at a wavelength of 340 nm.

The test sample 200 was rotated so as to be uniformly exposed to light. Using the above conditions, the irradiation of light was performed for 2000 hours.

Output (W) of each of the test samples was measured at an initial stage and after 2000 hours. The ratio of each output to that at the initial stage with respect to a test sample having no adhesive layer and protective layer (Comparative Example 1) was evaluated as "output efficiency". In this instance, the output efficiency of the test sample of Comparative Example 1 at the initial stage is represented by 100. Further, the surface state of the test sample after 2000 hours-weathering resistance test was observed with the naked eye.

The results are shown in Table 3 appearing below.

EXAMPLE 2

In the same manner as in Example 1, a solar cell up to the step of forming an $In_2O_3$ electrode was prepared.

Then, a dispersion for a protective layer was prepared by mixing 50 parts by weight of a resol-type phenolic resin (J-325, manufactured by Dainippon Inki Kagaku Kogyo K.K.), 50 parts of tin oxide fine particles having an average primary particle size of 0.05 μm and 100 parts of methyl cellosolve, and dispersing the mixture for 55 hours by means of a sand mill. An 80 μm-thick protective layer was formed by applying the resultant dispersion on the $In_2O_3$ electrode by beam coating, followed by drying for 40 minutes at 140° C.

The average particle size of tin oxide fine particles in the protective layer was measured as 0.05 μm.

The thus-prepared solar cell was evaluated in the same manner as in Example 1. The results are shown in Table 3.

EXAMPLE 3

Up to providing an $In_2O_3$ electrode, the solar cell was prepared in the same manner as in Example 1.

Then, a dispersion for a protective layer was prepared by mixing 30 parts of a bifunctional epoxy acrylate monomer, 70 parts of tin oxide fine particles having an average primary particle size of 0.045 μm, 0.1 part of 2-methylthioxanthone and 120 parts of toluene and dispersing the mixture for 47 hours by means of a sand mill. The resultant dispersion was applied onto the above-prepared In$_2$O$_3$ electrode by spray coating, followed by drying and exposure to a high-pressure mercury lamp for 30 seconds at a light intensity of 8 mW/cm$^2$ (radiation distance=70 cm) to form a protective layer of a thickness of 60 μm. The average particle size of the tin oxide fine particles in the protective layer was 0.05 μm.

The thus-prepared solar cell was evaluated in the same manner as in Example 1. The results are shown in Table 3.

EXAMPLE 4

A solar cell was prepared and evaluated in the same manner as in Example 3 except that ITO fine particles having an average primary particle size of 0.08 μm were used instead of the tin oxide fine particles. The average particle size of the ITO fine particles in the protective layer was 0.1 μm.

The results are shown in Table 3.

COMPARATIVE EXAMPLE 2

A solar cell was prepared and evaluated in the same manner as in Example 1 except that the ITO fine particles were not used.

The results are shown in Table 3.

COMPARATIVE EXAMPLE 3

A solar cell was prepared and evaluated in the same manner as in Example 2 except that the tin oxide fine particles were not used.

The results are shown in Table 3.

COMPARATIVE EXAMPLE 4

A solar cell was prepared and evaluated in the same manner as in Example 3 except that the tin oxide fine particles were not used.

The results are shown in Table 3.

COMPARATIVE EXAMPLE 5

Up to the In$_2$O$_3$ electrode, the solar cell was prepared in the same manner as in Example 1.

On the In$_2$O$_3$ electrode, a dispersion of a room temperature vulcanizing (RTV) silicone resin (7022, mfd. by Shinetsu Kagaku Kogyo K.K.) was applied by spray coating. The wet coating was dried and hardened by being left to stand for a day to form a 100 μm-thick protective layer.

The thus-prepared solar cell was evaluated in the same manner as in Example 1. The results are shown in Table 3.

TABLE 3

| Ex. No. | Output efficiency (%) | | Surface state of protective layer |
|---|---|---|---|
| | Initial | After 2,000 hrs. | After 2,000 hrs. |
| Ex. | | | |
| 1 | 93 | 91 | Not changed |
| 2 | 94 | 92 | Not changed |
| 3 | 92 | 91 | Not changed |
| 4 | 76 | 73 | Not changed |
| Comp. Ex. | | | |
| 1 | 100 | 0 | *1 |
| 2 | 94 | 61 | *2 |
| 3 | 95 | 60 | *2 |
| 4 | 94 | 62 | *2 |

TABLE 3-continued

| Ex. No. | Output efficiency (%) | | Surface state of protective layer |
|---|---|---|---|
| | Initial | After 2,000 hrs. | After 2,000 hrs. |
| 5 | 92 | 66 | *2 |

*1The electrode was corroded and the a-Si layer (photosensitive layer) was peeled off or removed.
*2Considerable dust adhered to the surface of the protective layer.

EXAMPLE 5 AND COMPARATIVE EXAMPLE 6

Aluminum was vacuum vapor deposited on a glass plate (size: 100×100 mm) to form an aluminum electrode (support).

Then, 4 parts or oxytitaniumphthalocyanine, 1 part of a polyvinyl butyryl (S-LEC BM-2, mfd. by Sekisui Kagaku Kogyo K.K.) and 100 parts of cyclohexane were mixed and dispersed by a sand mill with 1 mmφ-glass beads. To the dispersion, 100 parts of methyl ethyl ketone (MEK) was added, whereby a dilute dispersion was obtained.

The above-prepared aluminum electrode was dipped into the dilute dispersion, followed by drying for 10 minutes at 80° C. to form a photosensitive layer in a thickness of 0.5 μm.

On the photosensitive layer, a 0.05 μm-thick ITO electrode (size: 20×20 mm) was formed by vacuum vapor deposition.

An adhesive layer and a protective layer were formed on the ITO electrode in the same manner as in Example 1 except that the thickness of the protective layer was changed to 70 μm.

The thus-prepared solar cell (Example 5) and another solar cell separately prepared in the same manner as in Example 5 except for omitting the adhesive layer and the protective layer (Comparative Example 6) were subjected to a weathering resistance test and evaluated in the same manner as in Example 1, except that the testing time was changed to 100 hours.

The results are shown in Table 4 appearing below.

EXAMPLE 6

A solar cell was prepared and evaluated in the same manner as in Example 5, except that a protective layer was prepared in the same manner as in Example 2.

The results are shown in Table 4.

EXAMPLE 7

A solar cell was prepared and evaluated in the same manner as in Example 5, except that a protective layer was prepared in the same manner as in Example 3.

The results are shown in Table 4.

EXAMPLE 8

A solar cell was prepared and evaluated in the same manner as in Example 5, except that a protective layer was prepared in the same manner as in Example 4.

The results are shown in Table 4.

COMPARATIVE EXAMPLE 7

A solar cell was prepared and evaluated in the same manner as in Example 5, except that the ITO fine particles were not used.

The results are shown in Table 4.

COMPARATIVE EXAMPLE 8

A solar cell was prepared and evaluated in the same manner as in Example 6, except that the tin oxide fine particles were not used.

The results are shown in Table 4.

COMPARATIVE EXAMPLE 9

A solar cell was prepared and evaluated in the same manner as in Example 7, except that the tin oxide fine particles were not used.

The results are shown in Table 4.

COMPARATIVE EXAMPLE 10

Up to the ITO electrode, the solar cell was prepared in the same manner as in Example 5.

On the ITO electrode, a protective layer was formed in the same manner as in Comparative Example 5 to prepare a solar cell.

The above-prepared solar cell was evaluated in the same manner as in Example 5.

The results are shown in Table 4.

TABLE 4

| Ex. No. | Output efficiency (%) | | Surface state of protective layer |
|---|---|---|---|
| | Initial | After 100 hrs. | After 100 hrs. |
| Ex. | | | |
| 5 | 90 | 80 | Not changed |
| 6 | 91 | 82 | Not changed |
| 7 | 88 | 79 | Not changed |
| 8 | 70 | 60 | Not changed |
| Comp. Ex. | | | |
| 6 | 100 | 17 | *3 |
| 7 | 93 | 63 | *2 |
| 8 | 94 | 44 | *2 |
| 9 | 90 | 49 | *2 |
| 10 | 91 | 52 | *2 |

*2 Considerable dust adhered to the surface of the protective layer.
*3 A part of the photosensitive layer was peeled off or removed.

As described above, according to the present invention, there is provided a solar cell the surface of which is free from adhesion of dust and/or dirt and also having a stable (energy) conversion efficiency for a long period of time.

What is claimed is:

1. A solar cell, comprising a solar cell unit and an outer surface protective layer formed on the solar cell unit and exposed to incident solar radiation when said solar cell is in use, wherein the outer surface protective layer comprises conductive particles.

2. A solar cell according to claim 1, wherein the conductive particles are selected from the group consisting of a metal, an alloy, and a metal oxide.

3. A solar cell according to claim 2, wherein the conductive particles comprise a metal oxide.

4. A solar cell according to claim 1, wherein the conductive particles are dispersed in a resin component.

5. A solar cell according to claim 4, wherein the resin component is selected from the group consisting of polycarbonate, polyimide, polyvinyl chloride, a fluorine-containing resin, a phenolic resin, polyurethane, an acrylic resin, and a silicone resin.

6. A solar cell according to claim 4, wherein the resin component is a curable resin.

7. A solar cell according to claim 6, wherein the curable resin is selected from the group consisting of polyimide, a phenolic resin, polyurethane, an acrylic resin, and a silicone resin.

8. A solar cell according to claim 4, wherein the conductive particles before dispersion have an average primary particle size of at most 0.1 micron.

9. A solar cell according to claim 8, wherein the conductive particles before dispersion have an average primary particle size of at most 0.05 $\mu$m.

10. A solar cell according to claim 4, wherein the conductive particles in the protective layer have an average particle size of at most 0.3 $\mu$m.

11. A solar cell according to claim 10, wherein the conductive particles in the protective layer have an average particle size of at most 0.1 $\mu$m.

12. A solar cell according to claim 1, wherein the solar cell unit includes a photosensitive layer comprising an inorganic substance.

13. A solar cell according to claim 1, wherein the solar cell unit includes a photosensitive layer comprising an organic substance.

14. A solar cell according to claim 1, which further comprises an adhesive layer disposed between the solar cell unit and the outer surface protective layer.

15. A solar cell according to claim 1 or 4, wherein the conductive particles are contained in the protective layer in a proportion of 5–90 wt. %.

16. A solar according to claim 15, wherein the conductive particles are contained in the protective layer in a proportion of 10–80 wt. %.

* * * * *

UNITED STATES PATENT AND TRADEMARK OFFICE
CERTIFICATE OF CORRECTION

PATENT NO. : 5,354,385
DATED : October 11, 1994
INVENTOR(S) : YUICHI HASHIMOTO, ET AL.

It is certified that error appears in the above-identified patent and that said Letters Patent is hereby corrected as shown below:

COLUMN 1

After line 8, insert:
--Description of the Prior art
Related Background Art--.

COLUMN 3

Line 16, "5 w.%," should read --5 wt.%,--.

COLUMN 4

Line 60, "a" should read --an--.

COLUMN 5

Line 53, "Then," should read --Now,--.

COLUMN 10

Line 16, "or" should read --of--.

UNITED STATES PATENT AND TRADEMARK OFFICE
CERTIFICATE OF CORRECTION

PATENT NO. : 5,354,385
DATED : October 11, 1994
INVENTOR(S) : YUICHI HASHIMOTO, ET AL.

Page 2 of 2

It is certified that error appears in the above-identified patent and that said Letters Patent is hereby corrected as shown below:

COLUMN 12

Line 45, "solar" should read --solar cell--.

Signed and Sealed this

Fourteenth Day of February, 1995

Attest:

BRUCE LEHMAN

Attesting Officer

Commissioner of Patents and Trademarks